(12) United States Patent
Tanaka

(10) Patent No.: US 8,291,584 B2
(45) Date of Patent: Oct. 23, 2012

(54) METHOD OF MANUFACTURING A PRINTED WIRING BOARD WITH BUILT-IN ELECTRONIC COMPONENT

(75) Inventor: Hironori Tanaka, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 68 days.

(21) Appl. No.: 12/469,890

(22) Filed: May 21, 2009

(65) Prior Publication Data

US 2009/0293271 A1 Dec. 3, 2009

Related U.S. Application Data

(60) Provisional application No. 61/058,075, filed on Jun. 2, 2008.

(51) Int. Cl.
*H05K 3/30* (2006.01)

(52) U.S. Cl. .............................. 29/841; 29/832

(58) Field of Classification Search ............ 29/841, 29/825, 831, 832, 834, 846, 847; 174/250, 174/251, 258, 260, 261
See application file for complete search history.

(56) References Cited

U.S. PATENT DOCUMENTS

| | | | | |
|---|---|---|---|---|
| 5,120,678 A * | 6/1992 | Moore et al. | ........................... | 29/840 |
| 6,038,133 A * | 3/2000 | Nakatani et al. | ................. | 361/760 |
| 6,048,430 A * | 4/2000 | Johnston | ........................ | 156/233 |
| 6,239,983 B1 * | 5/2001 | Shingai et al. | ................ | 361/768 |
| 6,248,428 B1 * | 6/2001 | Asai et al. | ........................ | 428/206 |
| 6,339,197 B1 * | 1/2002 | Fushie et al. | .................... | 174/262 |
| 6,370,013 B1 * | 4/2002 | Iino et al. | ........................ | 361/306.3 |
| 6,391,762 B1 * | 5/2002 | Gamota et al. | ................. | 438/618 |
| 6,507,102 B2 * | 1/2003 | Juskey et al. | ................... | 257/706 |
| 6,724,638 B1 * | 4/2004 | Inagaki et al. | ................. | 361/763 |
| 6,928,726 B2 * | 8/2005 | Zollo et al. | ........................ | 29/832 |
| 6,995,321 B2 * | 2/2006 | Lee et al. | ........................ | 174/262 |
| 7,653,991 B2 * | 2/2010 | Mok et al. | ........................ | 29/847 |
| 7,842,887 B2 * | 11/2010 | Sakamoto et al. | ............ | 174/260 |
| 7,989,706 B2 * | 8/2011 | Shizuno | ........................ | 174/260 |
| 2005/0039948 A1 * | 2/2005 | Asai et al. | ....................... | 174/262 |
| 2006/0191711 A1 * | 8/2006 | Cho et al. | ........................ | 174/260 |
| 2007/0227765 A1 * | 10/2007 | Sakamoto et al. | ............ | 174/260 |
| 2009/0008765 A1 | 1/2009 | Yamano et al. | | |

FOREIGN PATENT DOCUMENTS

| | | |
|---|---|---|
| JP | 05-037151 | 2/1993 |
| JP | 11-220262 | 8/1999 |
| JP | 2007-019267 A | 1/2007 |
| JP | 2007-049004 A | 2/2007 |
| JP | 2007-088009 A | 4/2007 |
| JP | 2008-010885 A | 1/2008 |
| WO | WO 2004/089048 A1 | 10/2004 |
| WO | WO 2005/104635 A1 | 11/2005 |

* cited by examiner

*Primary Examiner* — David Angwin
(74) *Attorney, Agent, or Firm* — Oblon, Spivak, McClelland, Maier & Neustadt, L.L.P.

(57) ABSTRACT

A method for manufacturing a printed wiring board, including forming an alignment mark in a metal foil, forming a bump on the metal foil at a position determined based on the alignment mark, positioning an electronic component over the metal foil, the positioning comprising aligning a terminal of the electronic component with the bump based on the alignment mark, connecting the terminal of the electronic component with the bump, forming an insulation layer enclosing the electronic component connected with the bump such that the electronic component is placed inside a printed wiring board, and patterning the metal foil to which the electronic component is connected through the bump.

18 Claims, 15 Drawing Sheets though it is hard to accurately position the built-in electronic component at a higher degree of integration. Thus, an improved method for positioning an electronic component and producing a printed wiring board with an enhanced connection reliability is highly desired.

METHOD OF MANUFACTURING A PRINTED WIRING BOARD WITH BUILT-IN ELECTRONIC COMPONENT

CROSS-REFERENCE TO RELATED APPLICATIONS

This patent application claims the benefit of U.S. Provisional Patent Application No. 61/058,075, filed Jun. 2, 2008, which is incorporated by reference.

BACKGROUND OF THE INVENTION

Electronic devices have become highly functional and more compact. Therefore, high integration of circuit components on a printed wiring board is desired. To increase the degree of integration, a printed wiring board can have a built-in electronic component, instead of an electronic component mounted on the surface of the printed wiring board. However, it is hard to accurately position the built-in electronic component at a higher degree of integration. Thus, an improved method for positioning an electronic component and producing a printed wiring board with an enhanced connection reliability is highly desired.

BRIEF SUMMARY OF THE INVENTION

The invention provides a method for manufacturing a printed wiring board. In a method according to one embodiment of the present invention, an alignment mark is formed in a metal foil, a bump is formed on the metal foil at a position determined based on the alignment mark, an electronic component is aligned with the bump based on the alignment mark, the electronic component is connected with the bump, and an insulation layer is formed over the electronic component.

The invention also provides a printed wiring board. According to one embodiment, a printed wiring board includes a resin substrate, an electronic component, and an insulation layer. The resin substrate has an opening and includes a core material and a resin material. The electronic component is positioned in the opening. The insulation layer is formed over the resin substrate and the electronic component.

BRIEF DESCRIPTION OF THE SEVERAL VIEWS OF THE DRAWING(S)

DETAILED DESCRIPTION OF THE INVENTION

First Embodiment

Figure 7:
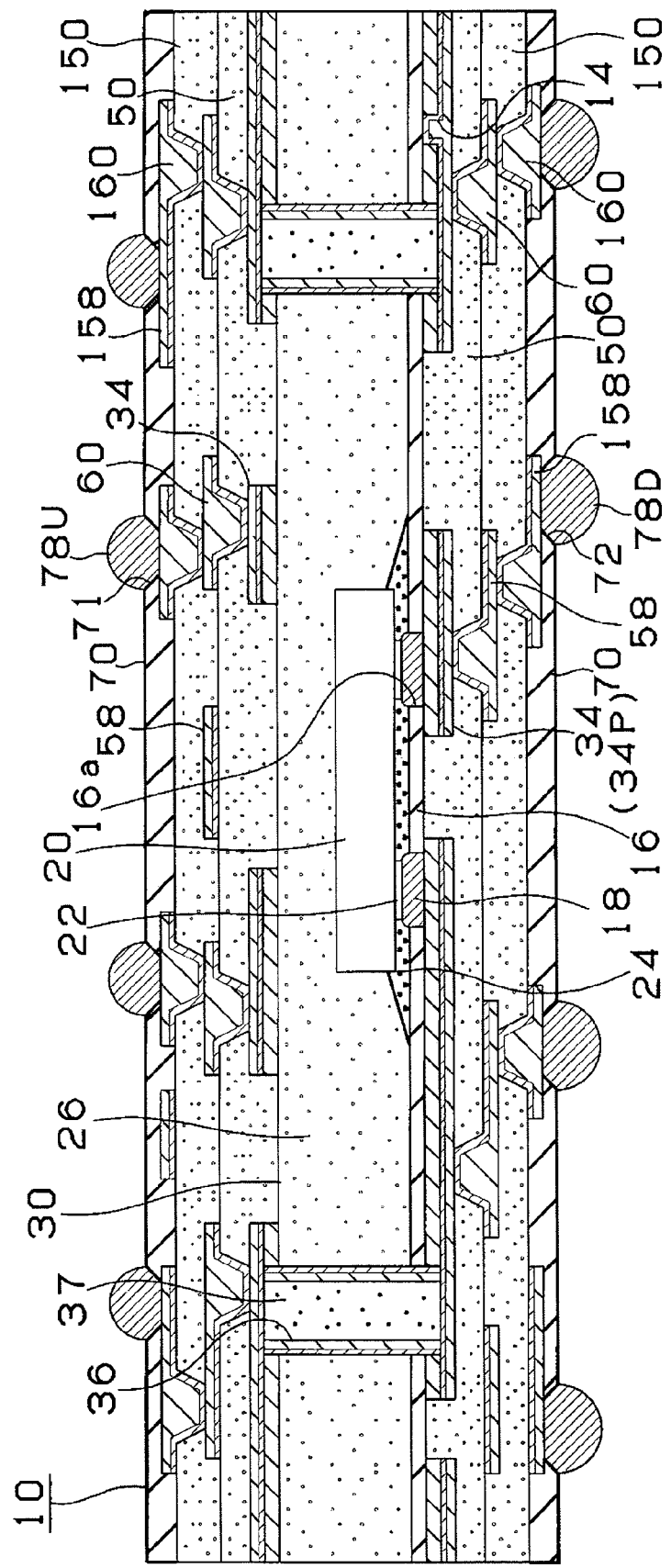
FIG. 7 is a cross-sectional view of a multilayer printed wiring board according to the First Embodiment.

FIG. 7 is a cross-sectional view of a multilayer printed wiring board 10 according to one embodiment of the present invention. In the illustrated embodiment, the multilayer printed wiring board 10 includes a core substrate 30 and interlayer insulation layers (50, 150) formed over the core substrate 30. The core substrate 30 has an electronic component 20, an insulation layer 26, conductive circuits 34, and a through-hole conductor 36. Hereinafter, the bottom surface of a layer or a substrate in the drawing is referred to as the first surface, and the top surface of the layer or the substrate is referred to as the second surface. The conductive circuit 34 formed over the first surface of the core substrate 30 has a pad portion (34P) on which a bump 18 is formed. A terminal 22 of the electronic component 20 is connected to the pad portion (34P) of the conductive circuit 34 through the bump 18. The through-hole conductor 36 has a filling agent 37 therein and connects the conductive circuits 34 formed over the first and second surfaces of the core substrate 30. Also, the conductive circuit 34 formed over the first surface of the core substrate 30 has an alignment mark 14 in the illustrated embodiment. As described later, the terminals 22 of the electronic component 20 are aligned with the bumps 18 at a significantly high accuracy by utilizing the alignment mark 14.

The interlayer insulation layer 50 and the interlayer insulation layer 150 are formed above the first and second surfaces of the core substrate 30. The interlayer insulation layer 50 has a via conductor 60 formed therein, and the interlayer insulation layer 150 has a via conductor 160 formed therein. A conductive circuit 58 is formed between the interlayer insulation layer 50 and the interlayer insulation layer 150. The conductive circuit 58 and the conductive circuit 34 are connected through the via conductor 60. A first resist layer 70 is formed on the interlayer insulation layer 150, and a conductive circuit 158 is formed between the interlayer insulation layer 150 and the first resist layer 70. The conductive circuit 158 and the conductive circuit 58 are connected through the via conductor 160. The first resist layer 70 formed on the second (top) surface of the multilayer printed wiring board 10 has openings 71 to form bumps (78U) such as solder bumps for mounting an electronic component such as an IC chip. The first resist layer 70 formed on the first (bottom) surface of the multilayer printed wiring board 10 has openings 72 to form bumps (78D) such as solder bumps for connection with an external substrate such as a daughter board.

The electronic component 20 is, for example, an IC chip. The electronic component 20 is accommodated in the core substrate 30 and placed inside the insulation layer 26. A second resist layer 16 is placed between the insulation layer 26 and the interlayer insulation layer 50. An underfill 24 is filled in the space between the second resist layer 16 and the electronic component 20. The second resist layer 16 has an opening (16a) where the bump 18 is formed.

A method for manufacturing the multilayer printed wiring board 10 according to the First Embodiment is described with reference to FIGS. 1A-6C. First, a method for manufacturing the core substrate 30 having a built-in electronic component 20 is described.

Figure 1A:
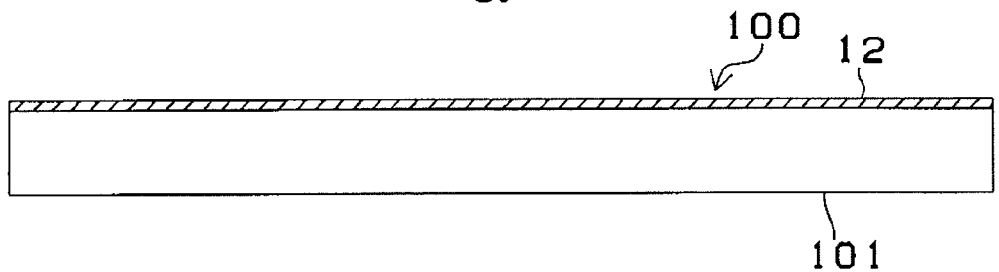
FIGS. 1A-1D are cross-sectional views of a multilayer printed wiring board being manufactured by a method according to the First Embodiment of the present invention.
Figure 12:
FIG. 12 is a cross-sectional view of a metal foil used in a method for manufacturing a printed wiring board.

(1) FIG. 1A shows a cross section of an exemplary starting material, that is, a carrier-attached metal foil 100 having a support body 101 and a metal foil 12. The metal foil 12 has a thickness in the range of, for example, about 1.5 μm to about 36 μm, and includes a conductive metal such as copper, aluminum or nickel. As for the support body 101, a conductive material such as aluminum, steel or copper, or an insulative film such as epoxy or polyimide can be used. The thickness of the support body 101 is in the range of, for example, about 18 μm to about 100 μm. The metal foil 12 can be attached to the support body 101 by for example, laminating the metal foil 12 on the support body 101 with a removable layer laid in between. The removable layer can comprise, for example, carboxy benzotriazole (CBTA), N',N'-bis(benzotriazolyl methyl) urea (BTD-U), or 3-amino-1H-1,2,4-triazole (ATA). The removal layer comprising such material allows the metal foil 12 to be more easily detached from the support body 101 at a later stage (see FIGS. 3A and 3B). Also, the removal layer can be easily removed from the surface of the metal foil 12. Instead of the metal foil 12 attached to the support body 101, the starting material can be the metal foil 12 alone (FIG. 12). The attachment to the support body 101 is optional.

Figure 1B:
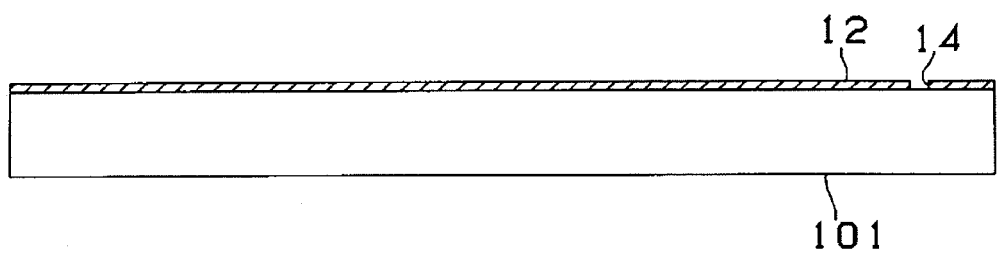

Subsequently, an alignment mark 14 is formed in the metal foil 12. For example, as shown in FIG. 1B, the alignment mark 14 can be an opening in the metal foil 12. The alignment mark 14 formed in the metal foil 12 can have any desirable shape including, for example, a circular shape, a cross-like shape, and a double circle. Preferably, the alignment mark 14 is a circular opening. The alignment mark 14 can be formed by, for example, a laser or etching. Instead of forming the alignment mark 14 in the metal foil 12, a through-hole formed in the metal foil 12 and the support body 101 (FIGS. 13A-13B) can be used as the alignment mark 14. Alternatively, the alignment mark 14 can be a patterned thin film formed on the metal foil 12. A thin film comprising a metallic material or a resin can be placed on the metal foil 12 and patterned to have a desirable shape through, for example, a blasting treatment where a resist is placed on a thin film and abrasives such as alumina and silicon carbide are applied to the thin film. The thin-film alignment mark formed on the metal foil 12 can have any desirable shape including, for example, a circular shape, a cross-like shape, and a double circle.

Figure 1C:
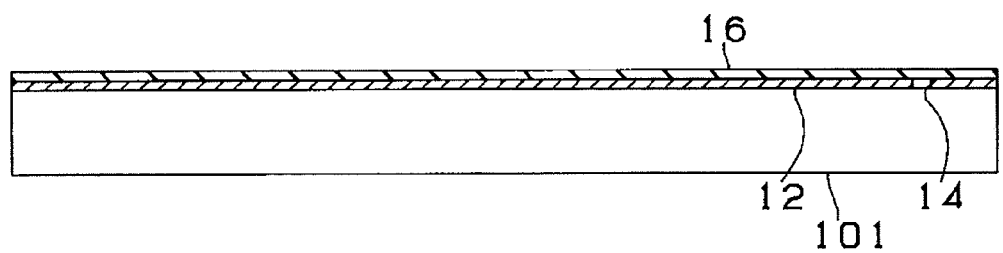
Figure 15A:
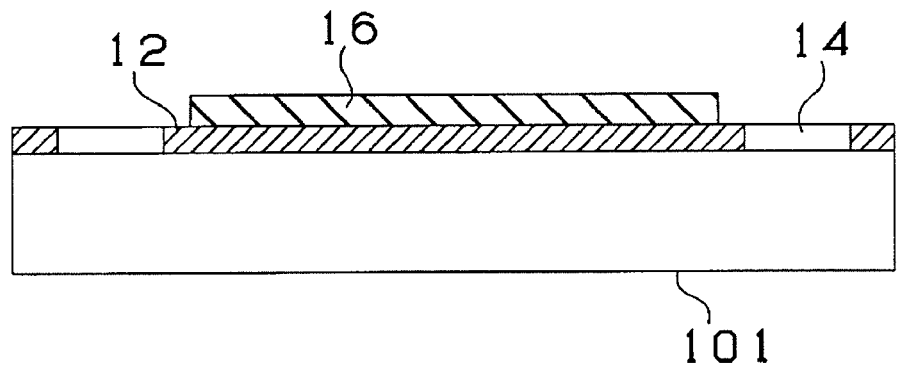
FIGS. 15A-15B are a cross-sectional view and a top view of a multilayer printed wiring board, showing an exemplary arrangement of a resist layer and alignment marks.
Figure 15B:
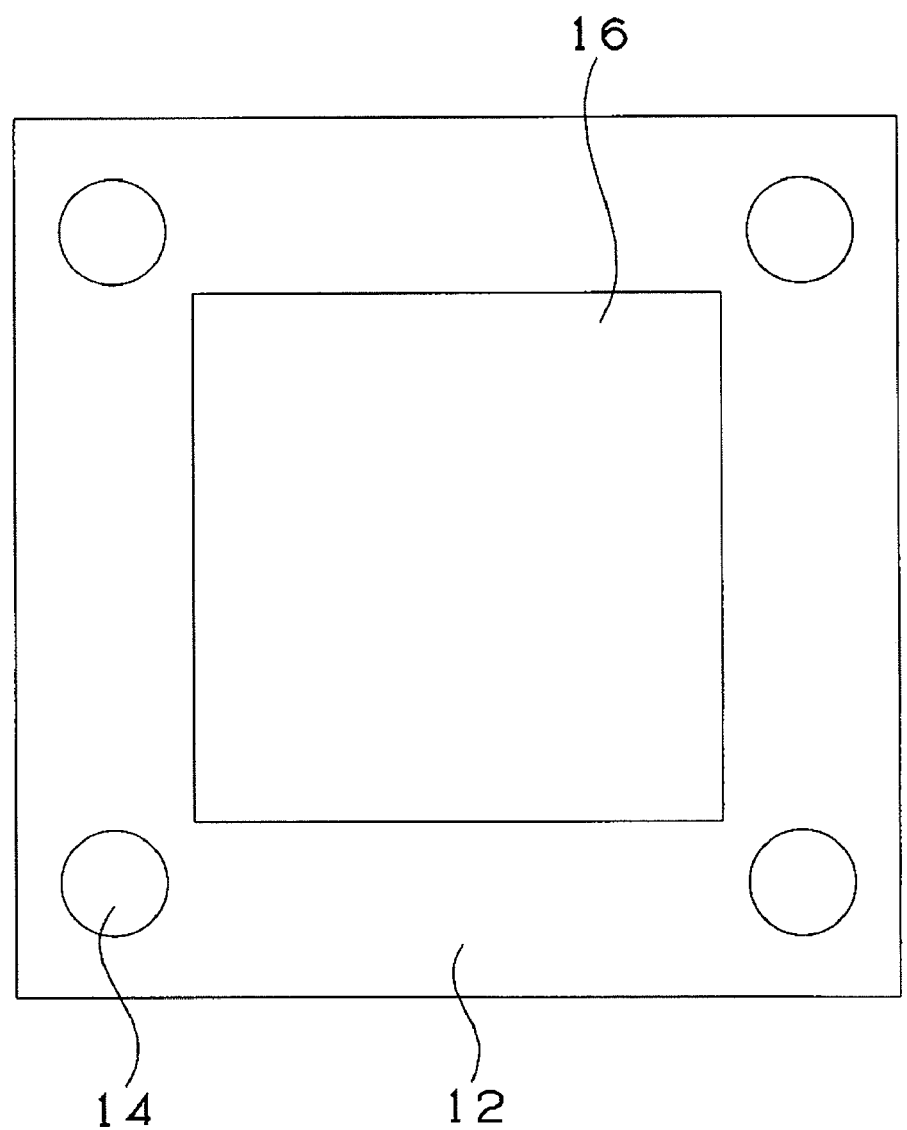

(2) On the second surface of the metal foil 12, the second resist layer 16 (FIG. 1C) is formed. After the second resist layer 16 is formed, the alignment mark 14 is detected to determine the position to form openings (16a) in the second resist layer 16. The alignment mark 14 can be covered or uncovered by the second resist layer 16. Typically, if the second resist layer 16 is transparent or translucent, the second resist layer 16 can cover the alignment mark 14, for example, as illustrated in FIG. 1C. If the second resist layer 16 is neither transparent nor translucent, the second resist layer 16 can be formed so as not to cover the alignment mark 14, for example, as illustrated in FIGS. 15A and 15B. Preferably, three or four alignment marks 14 are formed at the corner portions of the metal foil 12.

Figure 1D:
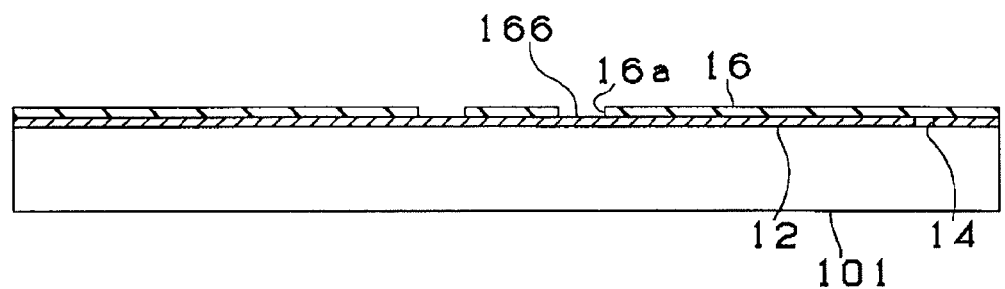

Subsequently, the openings (16a) are formed by using, for example, laser in the second resist layer 16 to expose a metal foil portion 166 (FIG. 1D). For example, the position of the openings (16a) can be determined based on the alignment mark 14 as follows. The position (original position) of the openings (16a) is pre-determined with reference to the location of the alignment mark 14. While the second resist layer 16 is formed on the metal foil 12, the metal foil 12 may be slightly deformed due to the heat, and thus the alignment mark 14 may be displaced. To calculate the amount of displacement of the alignment mark 14, the location of the alignment mark 14 after the formation of the second resist layer 16 can be measured by detecting a suitable position (for example, a center of a circle) of the alignment mark 14 by using, for example, a camera. The position of the openings (16a) is determined based on the calculated amount of displacement and the pre-determined original position of the openings (16a).

Figure 2A:
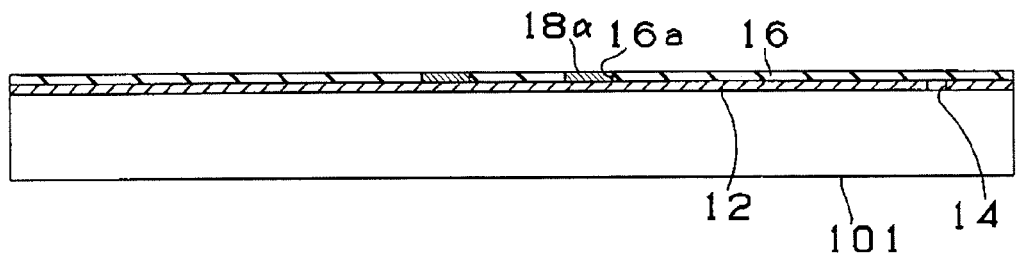
FIGS. 2A-2D are cross-sectional views of a multilayer printed wiring board being manufactured by the method according to the First Embodiment.
Figure 2B:
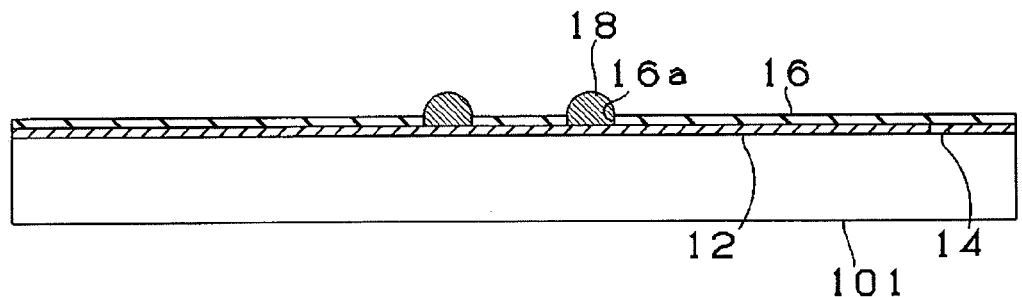

(3) A solder paste (18α) is applied to the openings (16a) formed in the second resist layer 16 (FIG. 2A). The solder paste (18α) can be applied by, for example, printing a solder material containing metals such as Sn/Pb, Sn/Ag, Sn/Sb, or Sn/Ag/Cu. Bumps 18 are formed in the openings (16a) (FIG. 2B). The bumps 18 can be formed by, for example, conducting a reflow at a temperature in the range of, for example, about 200° C. to about 280° C. Instead of the solder paste (18α), solder balls can be placed on the metal foil portion 166. Another example is to form gold bumps in the openings (16a). Gold bumps can be formed by, for example, electrolytic plating on the metal foil portion 166 in the second resist layer 16.

In order to place the solder paste (18α) or solder balls and form the bumps 18 at the accurate location, the alignment mark 14 is used as a reference point. The bumps 18 are formed at the position determined by using the alignment mark 14 which is also used for forming the openings (16a). Accordingly, the positional accuracy of the bumps 18 is enhanced, and the connection reliability between the bumps 18 and the metal foil 12 is higher. Also, the bumps 18 are placed in the openings (16a) formed in second resist layer 16, and the second resist layer 16 prevents the solder material from flowing out of the openings (16a) during the reflow process. Thus, fine-pitch bumps can be formed with high reliability. In addition, a short circuit among the bumps 18 is effectively prevented by the second resist layer 16.

Figure 2C:
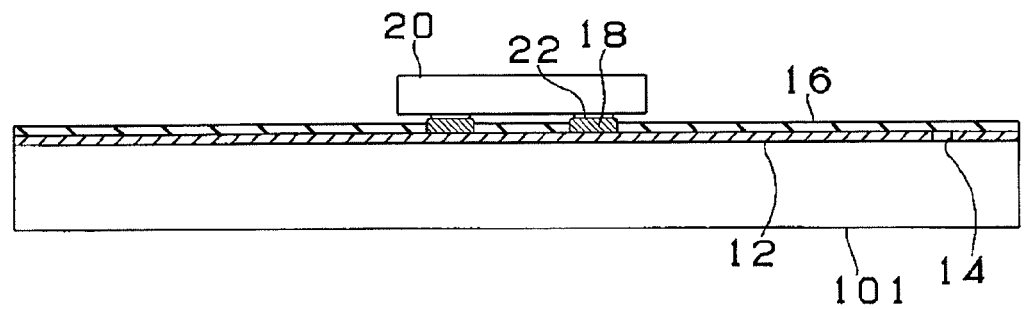

(4) The loading position of the electronic component 20 is also determined by using the alignment mark 14, so that the terminals 22 of the electronic component 20 are properly connected to the bumps 18. After aligning the electronic component 20 with the bump 18 based on the alignment mark 14, the electronic component 20 is mounted on the metal foil 12 (FIG. 2C). The bumps 18 and the terminals 22 are connected by, for example, conducting a reflow. Since the loading position of the electronic component 20 is determined using the alignment mark 14, high positional accuracy is achieved, and the connection reliability between the bumps 18 and the terminals 22 of the electronic component 20 is enhanced.

Also, electronic components such as an IC chip having full-grid terminals can be loaded without reducing the positional accuracy.

Figure 2D:
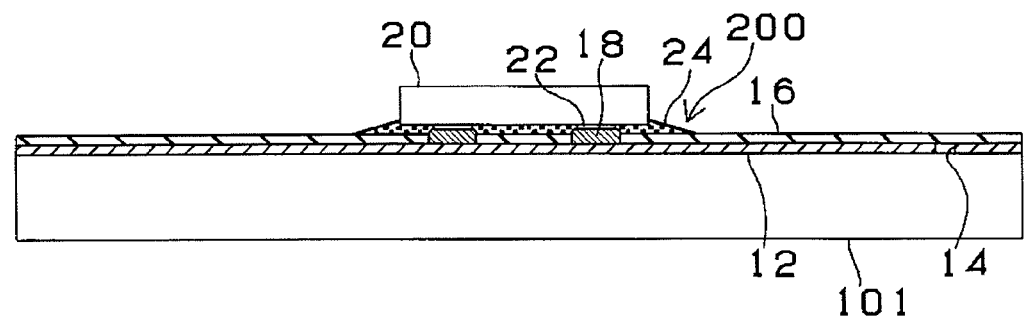

(5) The underfill 24 is supplied in the space between the second resist layer 16 and the electronic component 20 (FIG. 2D). As such, the connection reliability at the bumps 18 is enhanced. A substrate 200 having the electronic component 20 mounted on the metal foil 12 is obtained.

Figure 3A:
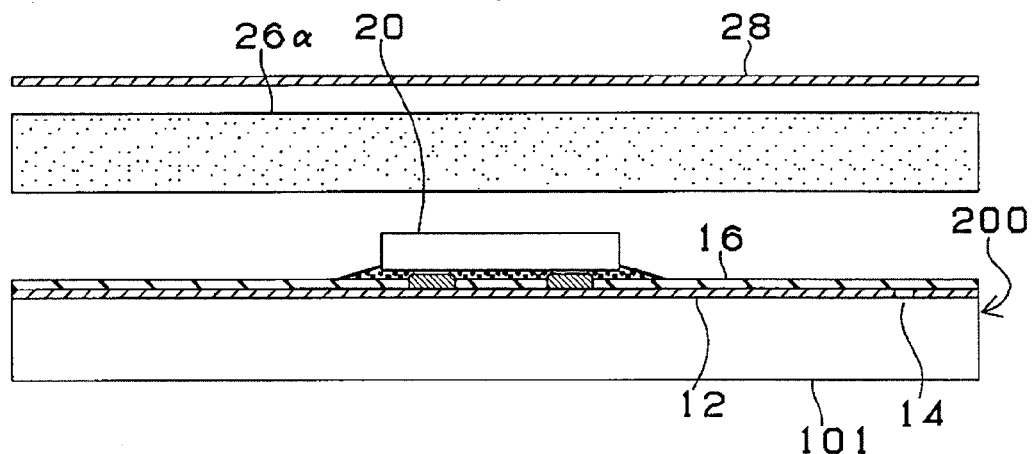
FIGS. 3A-3D are cross-sectional views of a multilayer printed wiring board being manufactured by the method according to the First Embodiment.
Figure 3B:
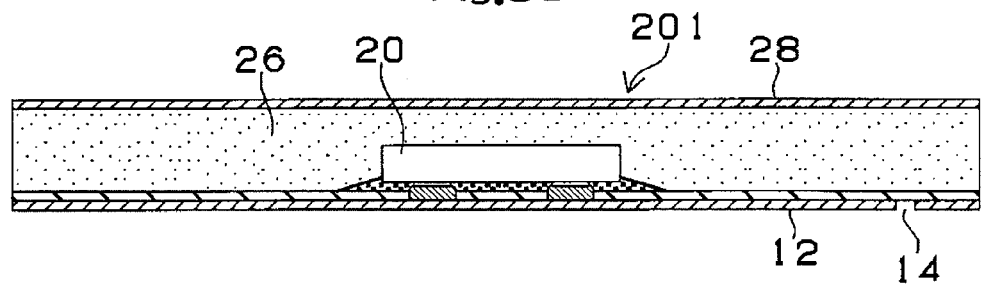

(6) As shown in FIG. 3A, a resin film (26α) and a metal foil 28 are placed over the second resist layer 16 and the electronic component 20, and the resin film (26α) is cured to form an insulation layer 26 enclosing the electronic component 20 therein (FIG. 3B). For example, the resin film (26α) can be a B-stage resin film containing a thermosetting resin. Highly heat resistant resins such as epoxy resin, phenolic resin, polyimide resin or cyanate resin are preferred. Epoxy resin has excellent resistance to heat and is thus especially preferred. In addition, the resin film (26α) desirably includes at least one inorganic filler. For example, $Al_2O_3$, $MgO$, $BN$, $AlN$, $BaSO_4$, and/or $SiO_2$ can be used as the inorganic filler. These inorganic fillers can be used in combination. For example, $SiO_2$ can be used with $BaSO_4$ or $Al_2O_3$. The amount of inorganic filler is preferred to be in the range of, for example, about 30 to about 60 wt. %. The metal foil 28 can have a thickness in the range of, for example, about 1.5 to about 36 μm. The resin film (26α) and the metal foil 28 can be thermopressed on the substrate 200 so that the electronic component 20 is fixed in the insulation layer 26. The thermopress can be performed at a temperature in the range of, for example, about 150° C. to about 170° C., and a pressure in the range of, for example, about 15 kg/cm$^2$ to about 30 kg/cm$^2$. Subsequently, the support body 101 is detached from the metal foil 12 by any proper method, for example, by mechanically peeling the support body 101 off the metal foil 12, to obtain an intermediate substrate 201 as shown in FIG. 3B. Preferably, the metal foil 12 and the metal foil 28 have substantially the same thickness. When the thickness is substantially the same, warping of the intermediate substrate 201 is more effectively prevented.

Figure 9A:
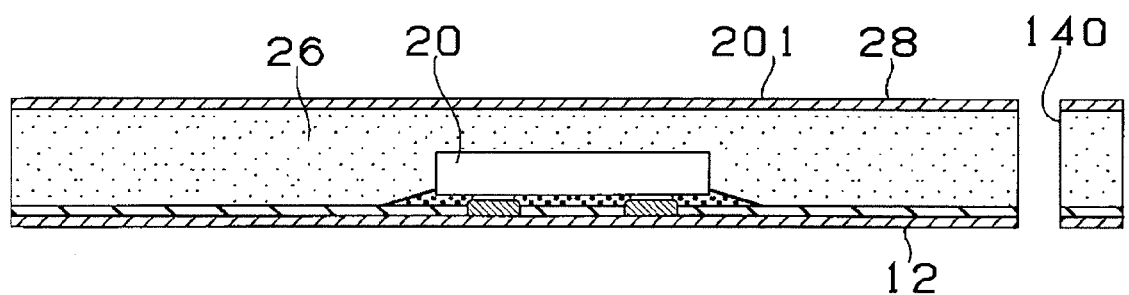
FIG. 9A is a cross-sectional view of an intermediate substrate produced during the manufacturing of a multilayer printed wiring board by the method according to the First Embodiment.

Depending on the conditions during manufacturing, a resin material of the support body 101 may be embedded in the alignment mark 14. If desired, the alignment mark 14 can be detected by using X-ray or any other suitable methods that allow accurate detection of the position of the alignment mark 14 even when the resin material is present. After the detection of the alignment mark 14, if desired, a second alignment mark (illustrated as a penetrating hole) 140 (see FIG. 9A) can be formed at a location determined based on the alignment mark 14. The position of the second alignment mark 140 can be the same as or different from the position of the alignment mark 14. Typically, if the second alignment mark 140 is formed at a position different from the alignment mark 14, a hole in the metal foil 12 or a penetrating hole as illustrated in FIG. 9A can be formed as the second alignment mark 140 at a desired location. If the second alignment mark 140 is formed at the same position as the alignment mark 14, a hole larger than the alignment mark 14 can be formed in the metal foil 12 as the second alignment mark 140. Alternatively, the second alignment mark 140 can be a penetrating hole formed at the same position as the alignment mark 14. The second alignment mark 140 is preferably a penetrating hole formed through the intermediate substrate 201 (see FIG. 9A), particularly, with a circular cross section.

Figure 3C:
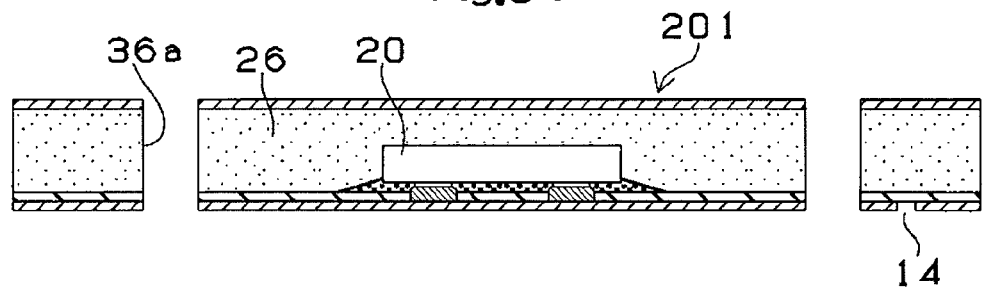
Figure 3D:
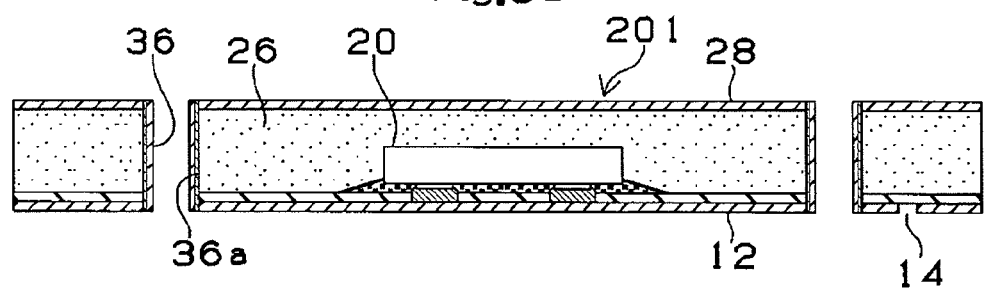

(7) Subsequently, through-holes (36a) are formed in the intermediate substrate 201 (FIG. 3C). The through-holes (36a) are formed at the positions determined based on the alignment mark 14 and/or the second alignment mark 140. Through-hole conductors 36 are formed in the through-holes (36a) (FIG. 3D). For example, an electroless plating treatment and an electrolytic plating treatment can be conducted to form the through-hole conductors 36. After these treatments, an electroless plated film and an electrolytic plated film are formed on the inner-wall of the through-holes (36a) as well as the first surface of the metal foil 12 and the second surface of the metal foil 28.

Figure 4A:
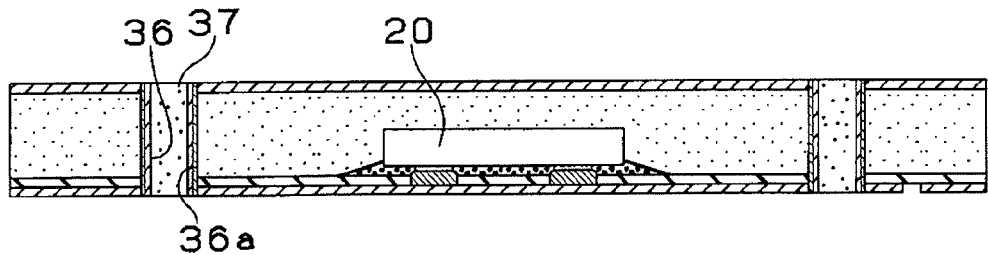
FIGS. 4A-4D are cross-sectional views of a multilayer printed wiring board being manufactured by the method according to the First Embodiment.

(8) A filling agent 37 is filled into the through-hole (36a) (FIG. 4A). The filling agent 37 is dried and cured. The filling agent 37 can comprise a resin material and particles. The resin material can be, for example, an epoxy type resin, a bismaleimide triazine (BT) type resin, a polyimide type resin, or a thermosetting polyolefin type resin. The particles can be, for example, silica, alumina, or barium sulfate.

Figure 4B:
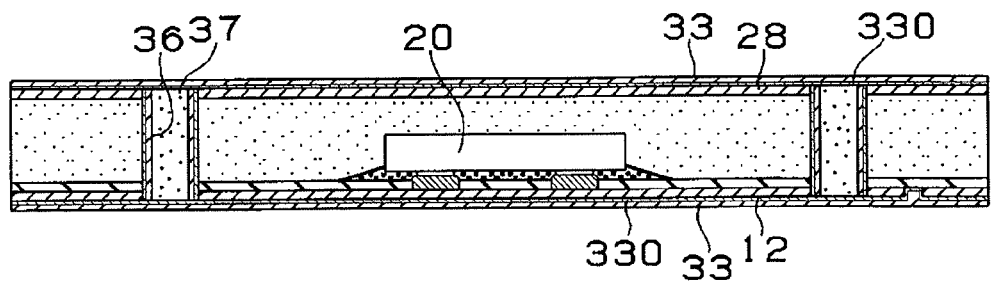

(9) Electroless plating and electrolytic plating are used to form an electroless plated film 330 and an electrolytic plated film 33 over the metal foils (12, 28) (FIG. 4B). The filling agent 37 is also covered with the electroless plated film 330 and the electrolytic plated film 33.

Figure 4C:
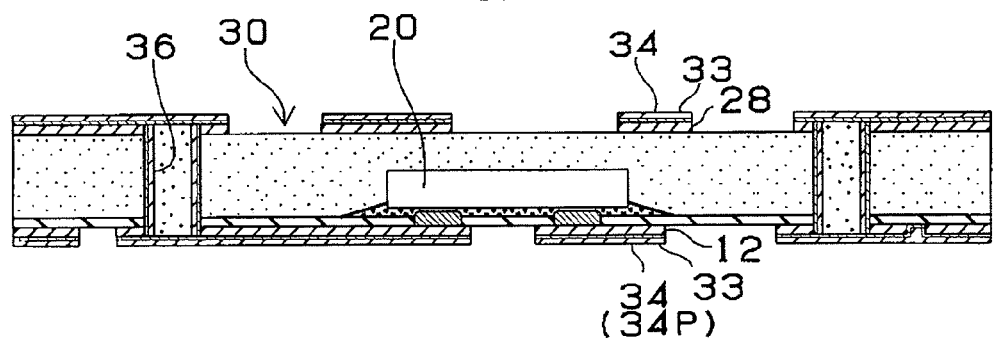
Figure 9B:
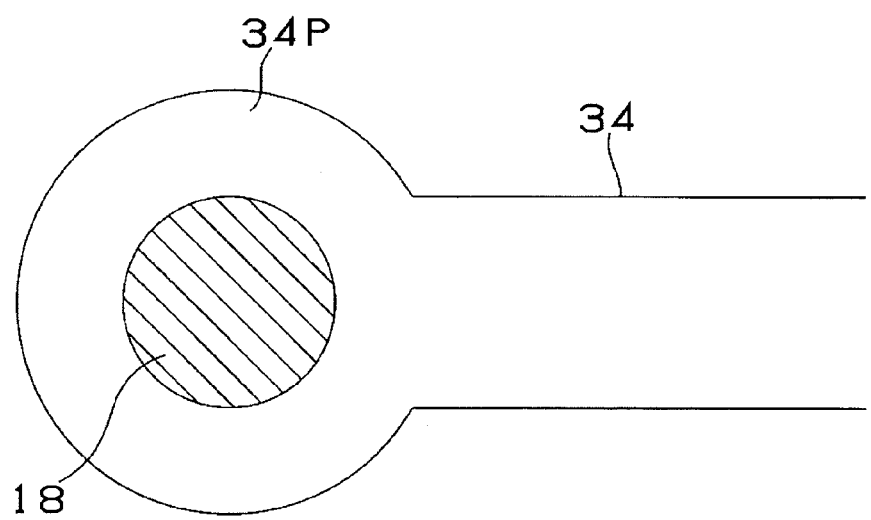
FIG. 9B is a plan view of a pad portion of a conductive circuit produced during the manufacturing of a multilayer printed wiring board by the method according to the First Embodiment.

(10) Subsequently, a conductive circuit 34 is formed over the insulation layer 26 and the filling agent 37 (FIG. 4C). One exemplary method for forming the conductive circuit 34 is as follows. An etching resist is placed on the electrolytic plated film 33 and exposed to light, and developed to form an etching resist pattern. The etching resist pattern is formed at a desired location by using the alignment mark 14 and/or the second alignment mark 140. Portions of the plated films (electroless plated film 330 and electrolytic plated film 33) and metal foils (12, 28), which are not covered by the etching resist, are dissolved and removed using an etching solution. The etching resist is removed to form the conductive circuit 34 over the insulation layer 26 and the filling agent 37. A core substrate 30 having the conductive circuits 34 on the first and second surfaces is thus obtained. At least one part of the conductive circuit 34 is used as a pad portion (34P) for connection to the bump 18 (see FIG. 9B). At the same time as the formation of the conductive circuits 34, a mark for alignment used to determine the position of via holes or other members later in the manufacturing process of the wiring board can be formed over the insulation layer 26. Such a mark can be made from the same material as the conductive circuits 34 and comprised of an electroless plated film and an electrolytic film.

Subsequently, the interlayer insulation layers (50, 150) and the conductive circuits (58, 158) are formed above the core substrate 30. One exemplary method is as follows.

Figure 4D:
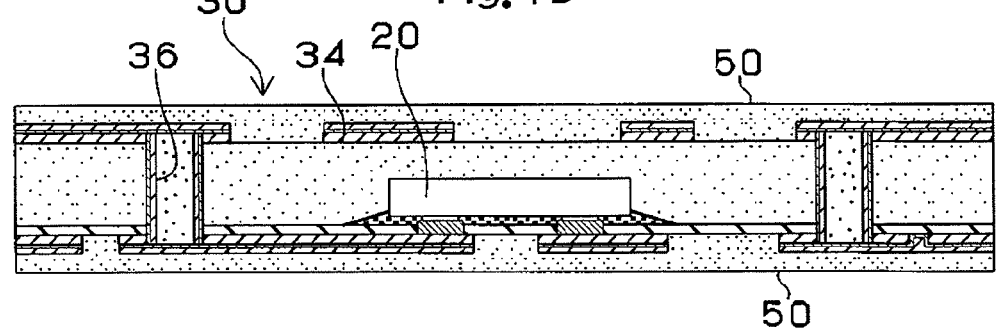

(11) An interlayer insulation layer 50 is formed on each of the first and second surfaces of the core substrate 30 (FIG. 4D). The interlayer insulation layer 50 can be formed by, for example, laminating a resin film containing, for example, a polyimide type resin, an epoxy type resin, and/or a thermosetting polyolefin type resin. Also, if desired, a thermoplasting type resin can be used with a thermosetting type resin.

Figure 5A:
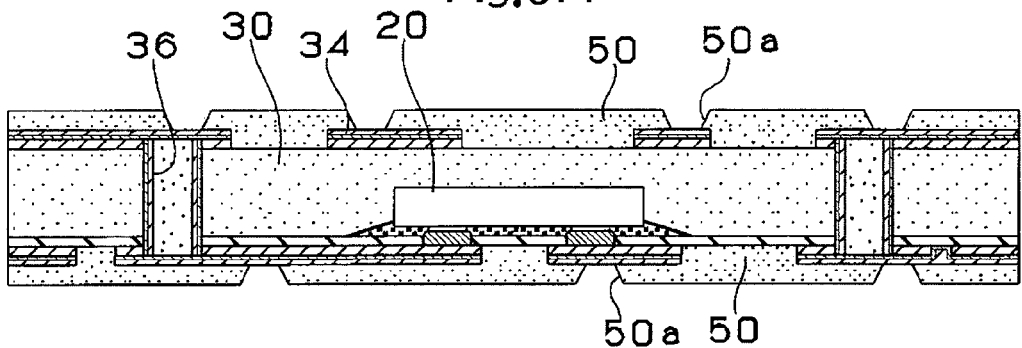
FIGS. 5A-5D are cross-sectional views of a multilayer printed wiring board being manufactured by the method according to the First Embodiment.

(12) Via-hole openings (50a) are formed in the interlayer insulation layer 50 (FIG. 5A). The via-hole openings (50a) can be formed by, for example, using a laser or through a photolitho process. When an alignment mark is formed simultaneously with the conductive circuit 34, the alignment mark can be used to form the via-hole openings (50a) at desired locations.

Figure 5B:
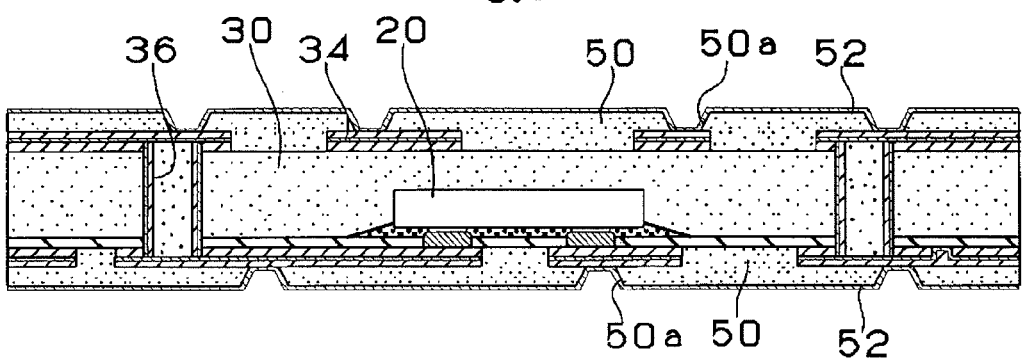

(13) Electroless plating such as electroless copper plating is used to form an electroless plated film 52 on the surface of the interlayer insulation layer 50 and the inner walls of the via-hole openings (50a) (FIG. 5B).

Figure 5C:
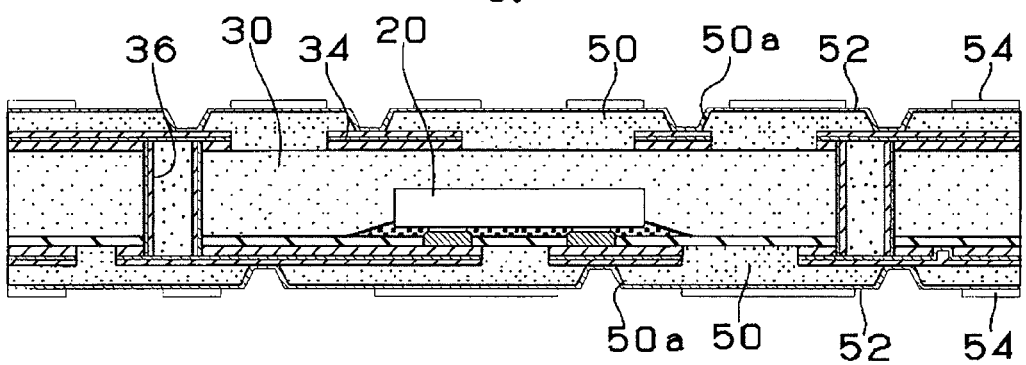
Figure 5D:
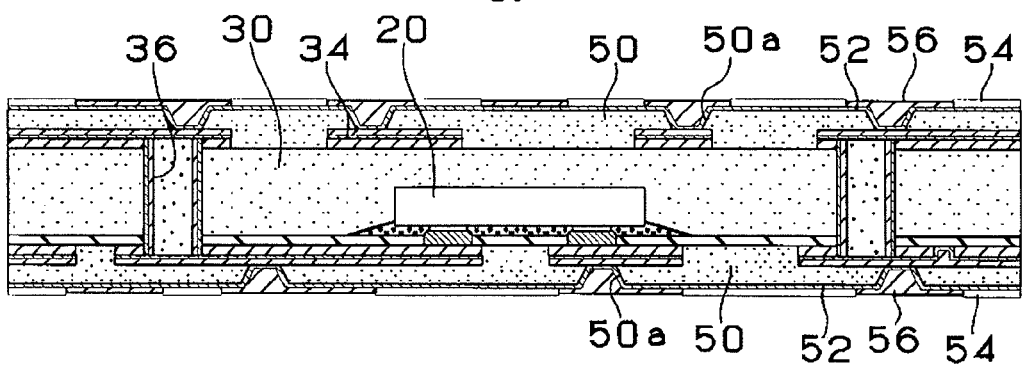

(14) A plating resist 54 is formed on the electroless plated film 52 (FIG. 5C). By electrolytic plating such as electrolytic copper plating, an electrolytic plated film 56 is formed in the area where the plating resist 54 is not present (see FIG. 5D). The electrolytic plated film 56 can have a thickness of, for example, about 5 μm to about 15 μm.

Figure 6A:
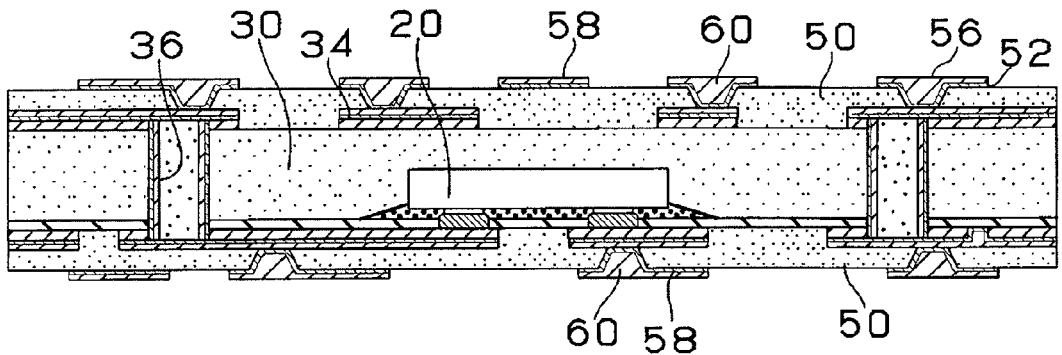
FIGS. 6A-6C are cross-sectional views of a multilayer printed wiring board being manufactured by the method according to the First Embodiment.

(15) After removing the plating resist 54, the electroless plated film 52 underneath the plating resist 54 is dissolved and removed by, for example, an etching treatment. An independent conductive circuit 58 and via conductors 60 are formed (FIG. 6A).

Figure 6B:
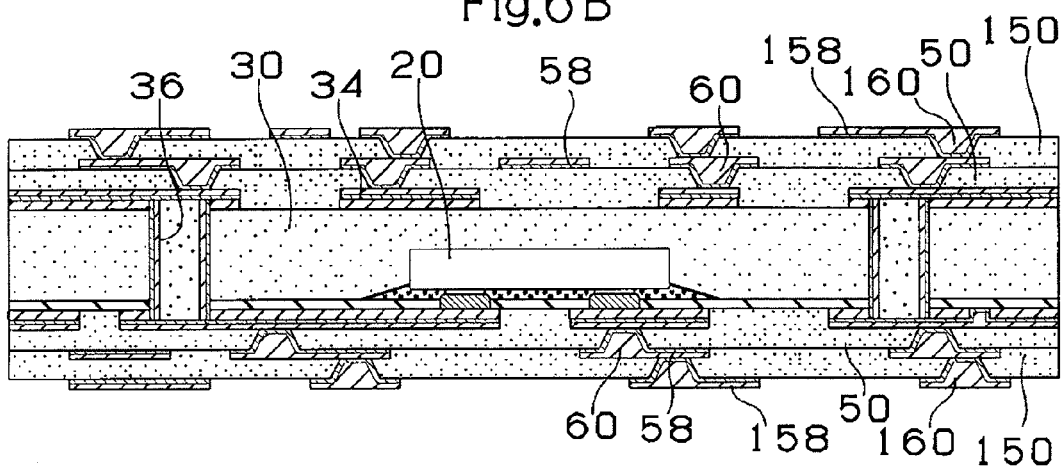

(16) By repeating (11)-(15), the upper-layer interlayer insulation layers 150 having conductive circuits 158 and via conductors 160 are formed to obtain the wiring board as shown in FIG. 6B.

Figure 6C:
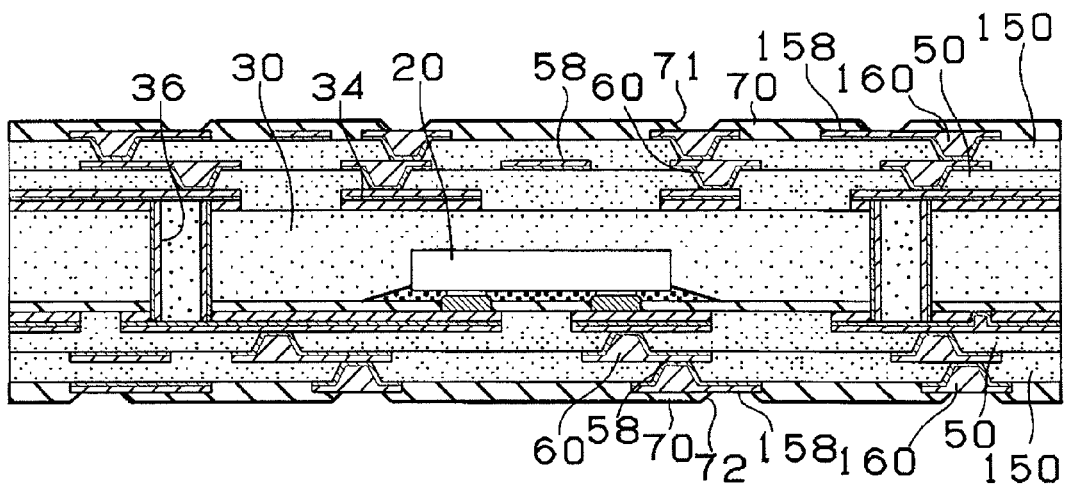

(17) Subsequently, a first resist layer 70 is formed on each of the first and second surfaces of the wiring board, and openings (71, 72) are formed in the first resist layers 70 (FIG. 6C).

(18) Bumps (78U) and bumps (78D) are formed in the openings 71 and openings 72, respectively. For example, the bumps (78U, 78D) are solder bumps formed by printing solder paste in the openings (71, 72) and conducting a reflow. The multilayer printed wiring board 10 as illustrated in FIG. 7 is thus obtained.

As described above, according to the method of the First Embodiment, a multilayer printed wiring board having a built-in electronic component is produced with a high connection reliability. In particular, since the openings (16a) are formed at a location determined based on the alignment mark 14 formed on the metal foil 12, and the bumps 18 are formed therein, the positional accuracy of the bumps 18 is higher, and the connection reliability is enhanced. Furthermore, the solder material for forming the bump 18 can be applied inside the openings (16a) of the second resist layer 16, and the second resist layer 16 prevents the solder material from flowing out during the reflow process. Accordingly, the method can be used for forming fine-pitched solder bumps. The second resist layer 16, however, is not required and can be omitted if desired. In that case, the manufacturing method can be modified as follows.

Second Embodiment

A manufacturing method of the Second Embodiment is described with reference to FIGS. 8A-8D.

Figure 8A:
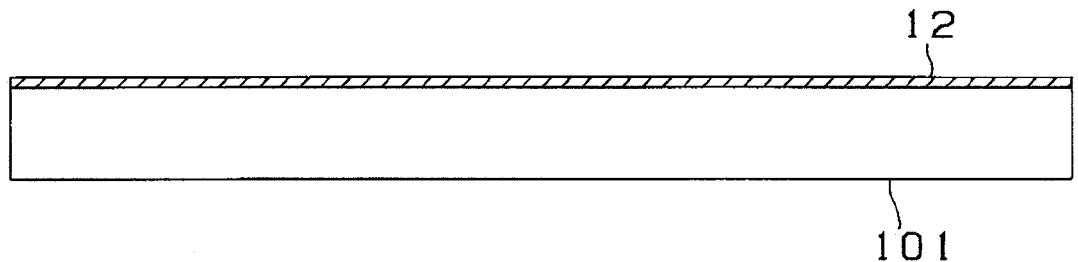
FIGS. 8A-8D are cross-sectional views of a multilayer printed wiring board being manufactured by a method according to the Second Embodiment.
Figure 8B:
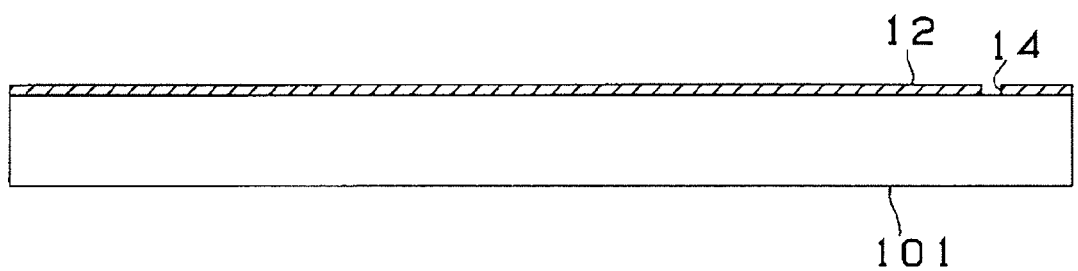
Figure 8C:
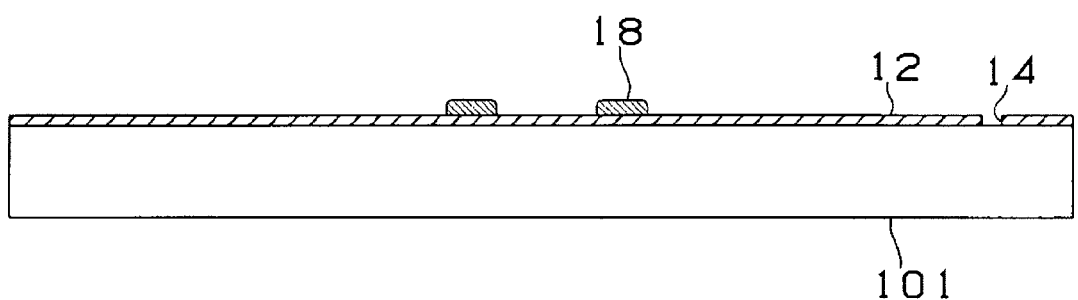

FIG. 8A shows an exemplary starting material, which is a metal foil 12 attached to a support body (carrier) 101. Although not shown in FIG. 8A, a removable layer can be placed between the metal foil 12 and the support body 101. The removable layer can comprise, for example, carboxy benzotriazole (CBTA), N',N'-bis(benzotriazolyl methyl) urea (BTD-U), or 3-amino-1H-1,2,4-triazole (ATA). The removal layer comprising such material allows the metal foil 12 to be more easily detached from the support body 101 at a later stage (see FIGS. 3A and 3B). Also, the removal layer can be easily removed from the surface of the metal foil 12. The support body 101 can be a metal foil such as a copper foil having a thickness of, for example, about 18 to about 100 μm. The metal foil 12 such as a copper foil can have a thickness of, for example, about 1.5 to about 36 μm. An alignment mark 14 is formed in the metal foil 12 (FIG. 8B). The alignment mark 14 can be formed by using, for example, a laser.

Bumps 18 (FIG. 8C) are formed on the metal foil 12 at positions determined based on the alignment mark 14. One method to form the bumps 18 is to apply solder paste by potting or printing and conducting a reflow.

Figure 8D:
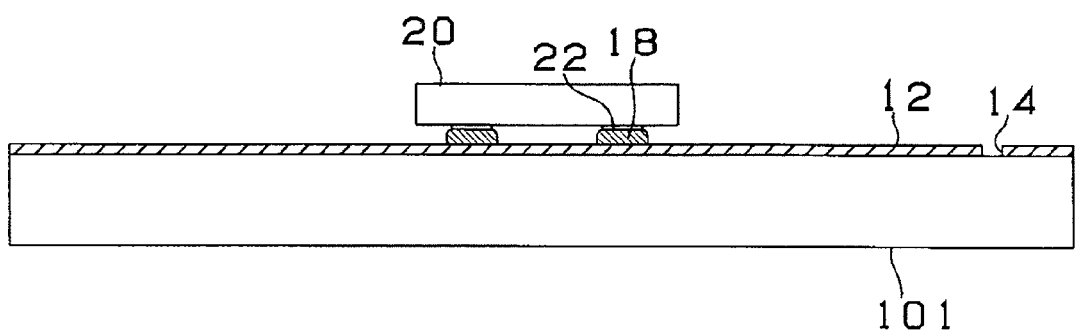

The electronic component 20 is aligned with the bumps 18 by using the alignment mark 14 as a reference point, and the electronic component 20 is mounted on the bumps 18 (FIG. 8D). For example, a reflow can be conducted to connect the bumps 18 and terminals 22 of the electronic component 20. Thereafter, the procedures described in the First Embodiment can be followed to obtain a multilayer printed wiring board. Similarly to the First Embodiment, positioning of the electronic component 20 and formation of bumps 18 are conducted based on the same alignment mark 14. Thus, an excellent positional accuracy between the bumps 18 and electronic component 20 is achieved. As a result, the connection reliability is enhanced between the electronic component such as an IC chip and a printed wiring board in which the electronic component is built.

Third Embodiment

Figure 11:
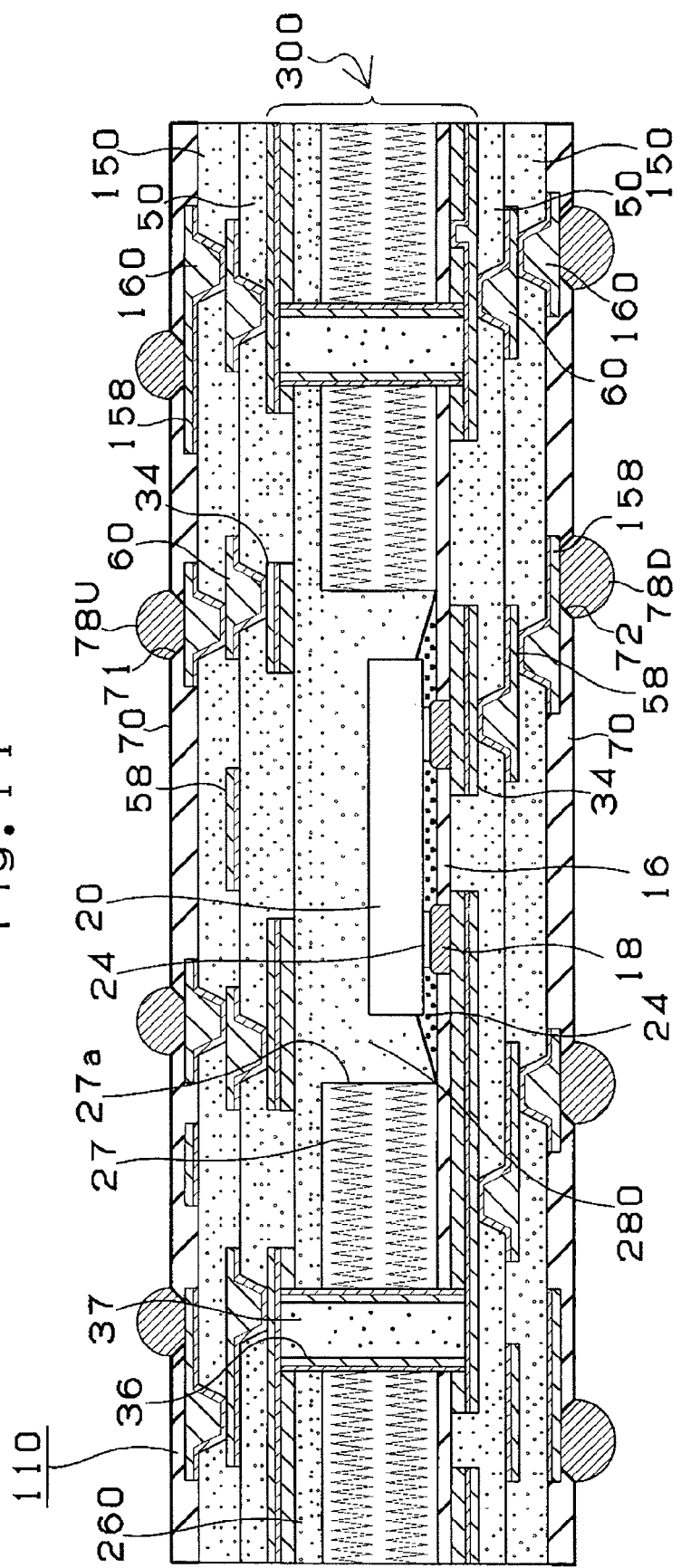
FIG. 11 is a cross-sectional view of a multilayer printed wiring board according to the Third Embodiment.

FIG. 11 shows a cross-sectional view of a multilayer printed wiring board 110 according to the Third Embodiment of the present invention. The multilayer printed wiring board 110 is similar to the multilayer printed wiring board 10 shown in FIG. 7, except that the multilayer printed wiring board 110 includes a core substrate 300 having a resin substrate 27. The resin substrate 27 includes a core material, such as glass cloth, glass fabric or aramid fabric, and a cured resin. The resin substrate 27 including such a core material provides a sufficient rigidity and enhanced reliability. The resin substrate 27 can be made by, for example, curing a prepreg in which a core material is impregnated with a thermosetting resin such as epoxy, or a resin complex. The term "resin complex" refers to a mixture of one or more thermosetting resins and one or more thermoplastic resins where at least some of the thermosetting resin(s) and the thermoplastic resin(s) are chemically bonded to one another. The thermoplastic resin can be, for example, polyethersulphone (PES). The resin substrate 27 comprising such a resin complex can achieve increased fracture toughness. The resin substrate 27 has an opening (27a) in which an electronic component 20 is accommodated and a filler resin 280 is filled. An insulation layer 260 is formed over the resin substrate 27 and the electronic component 20. Similarly to the First Embodiment, an underfill 24 is present in the space between a second resist layer 16 and the electronic component 20.

A method for manufacturing the multilayer printed wiring board 110 according to the Third Embodiment is described with reference to FIGS. 10A-10C.

Figure 10A:
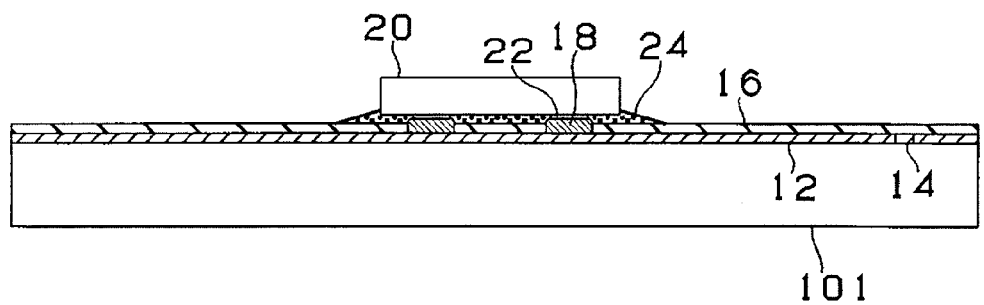
FIGS. 10A-10C are cross-sectional views of a multilayer printed wiring board being manufactured by a method according to the Third Embodiment.

The procedures for obtaining the structure illustrated in FIG. 10A are similar to the First Embodiment. Specifically, a metal foil 12 having an alignment mark 14 is prepared, and the second resist layer 16 is formed on the metal foil 12. The electronic component 20 is placed over the second resist layer 16, and terminals 22 of the electronic component 20 and bumps 18 are connected. The space between the electronic component 20 and the second resist layer 16 is filled with the underfill 24.

An insulative film (27α) (FIG. 10B) having an opening (27a) is prepared. For example, the insulative film (27α) can be made from a core material and a B-stage resin. Examples of the core material include glass cloth or aramid fabric, and examples of the B-stage resin include a thermosetting resin or a resin complex of a thermosetting resin and a thermoplastic resin. A second insulative film (260α) and a metal foil 28 are also prepared. The second insulative film (260α) does not have an opening. For example, the second insulative film (260α) can contain a resin material, preferably a prepreg or an insulative film including a resin and a core material such as glass cloth, glass fabric or aramid fabric. The material for the resin film (26α) in the First Embodiment can be used for the second insulative film (260α) as well. Also, the second insulative film (260α) can be, for example, a film containing a thermosetting resin and inorganic filler in the range of about 70 to about 90 wt. %. As for the insulative film (27α), the same material as the second insulative film (260α) (prepreg, resin film or film made with an inorganic filler and a thermosetting resin) can be used if desired. The metal foil 28 can be, for example, a copper foil. Desirably, the thickness of the metal foil 28 is substantially the same as the thickness of the metal foil 12. The thickness of the insulative film (27α) can be, for example, about 100 μm to about 400 μm, preferably about 150 μm. The thickness of the second insulative film (260α) can be, for example, about 50 μm to about 200 μm, preferably about 50 μm. The thickness of the metal foil 28 can be, for example, about 1.5 μm to about 36 μm.

Figure 10B:
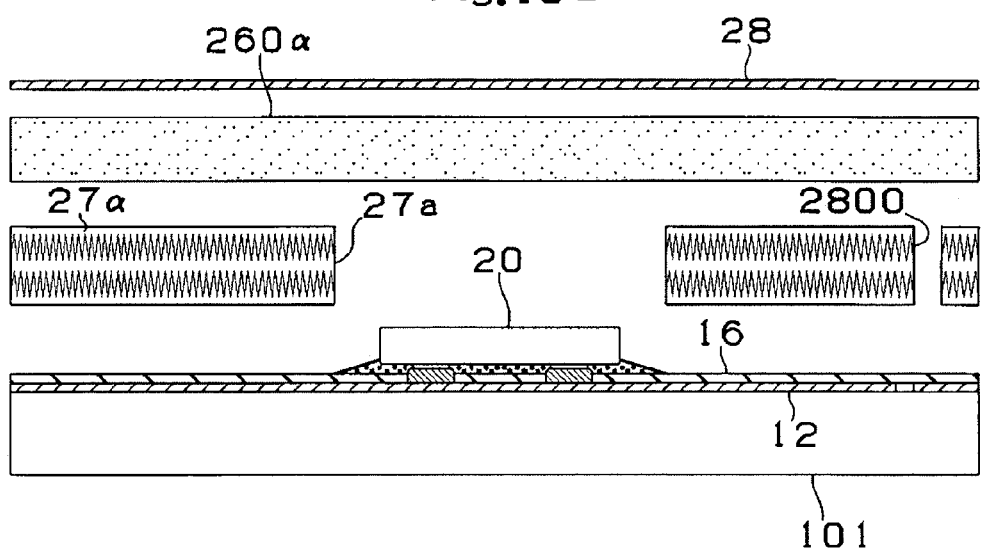
Figure 10C:
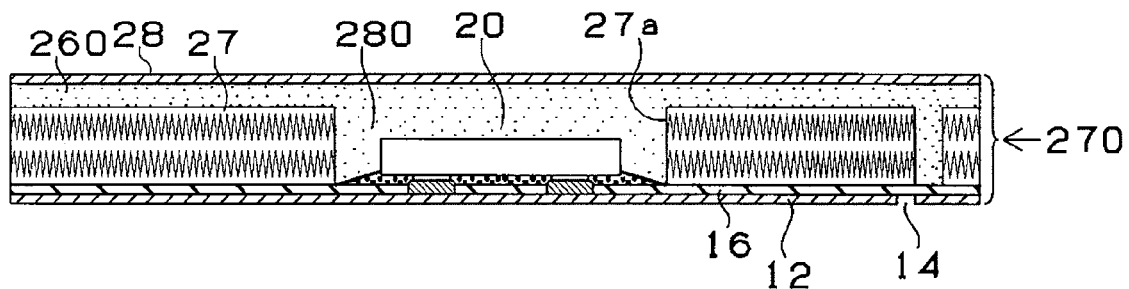

The insulative film (27α), the second insulative film (260α), and the metal foil 28 are placed over the electronic component 20 so that the opening (27a) is aligned with the electronic component 20 as shown in FIG. 10B. The insulative film (27α) and the electronic component 20 can be aligned by using the alignment mark 14 as well as an alignment mark 2800 formed in the insulative film (27α). For example, the alignment of the insulative film (27α) and the electronic component 20 can be performed as follows. The alignment mark 14 can be formed at one or more positions such as near the four corners of the metal foil 12. After the alignment marks 14 are detected by using, for example, a camera, the position of the center of the electronic component 20 is calculated. The alignment mark 2800 can be also formed at one or more positions such as near the four corners of the insulative film (27α). The alignment marks 2800 are detected by using, for example, a camera, and the position of the center of the opening (27a) is calculated. The insulative film (27α) is placed over the second resist layer 16 and the metal foil 12 so that the center of the electronic component 20 and the center of the opening (27a) are aligned with each other. After the alignment, positioning holes can be formed at multiple locations such as four corners of the metal foil 28 through the metal foil 28, the second insulative film (260α), the insulative film (27α), the second resist layer 16, and the metal foil 12. After pins (positioning pins) are placed in the positioning holes, the insulative film (27α), the second insulative film (260α) and the metal foil 28 are thermopressed to enclose the electronic component 20 in the second insulative film (260α). During the thermopress, the resin material seeps from the second insulative film (260α) and/or the insulative film (27α) into the opening (27a) of the insulative film (27α) and fills the opening (27a). At the same time, the insulative film (27α), the second insulative film (260α), and the resin material filled in the opening (27a) are cured. The insulative film (27α) is cured to form a resin substrate 27, and the second insulative film (260α) is cured to form an insulation layer 260 (FIG. 10C). The resin substrate 27 and the insulation layer 260 are adhered to each other and form an insulation substrate 270.

The insulation substrate 270 has a first surface attached to the second resist layer 16. The filler resin 280 filled in the opening (27a) includes the material contained in the second insulative film (260α) and/or the insulative film (27α), and desirably includes an inorganic filler and at least one type of thermosetting resin. The amount of the inorganic filler is preferably from about 30 to about 90 wt. %. The intermediate substrate shown in FIG. 10C corresponds to the intermediate substrate 201 of FIG. 3B in the First Embodiment. By following the procedures similar to the First Embodiment (see FIGS. 3C-4C), the core substrate 300 can be obtained. In the example illustrated in FIG. 11, the core substrate 300 has the resin substrate 27, the insulation layer 260, the electronic component 20 accommodated in the filler resin 280, conductive circuits 34, and through-hole conductors 36. Since the core substrate 300 includes the resin substrate 27 having a core material such as glass cloth or aramid fabric, the core substrate 300 has higher strength and enhanced reliability which are not deteriorated even after heat-cycle testing.

Fourth Embodiment

A method for manufacturing a multilayer printed wiring board according to the Fourth Embodiment is described by referring to FIGS. 13A-13D and FIGS. 14A-14B. The method in this embodiment is similar to the First Embodiment, except that a resist layer formed on a metal foil is removed after forming the bump.

Figure 13A:
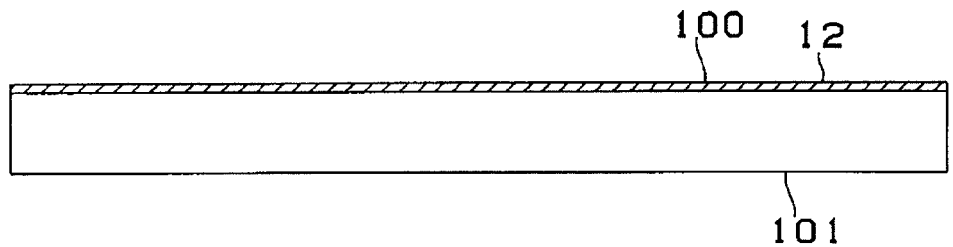
FIGS. 13A-13D are cross-sectional views of a multilayer printed wiring board being manufactured by a method according to a Fourth Embodiment.
Figure 13B:
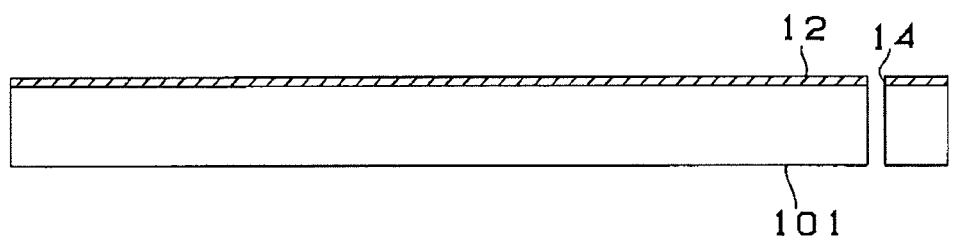

The starting material can be the same as that of First Embodiment. For example, as shown in FIG. 13A, a metal foil 12 provided on a support body 101 can be used. An alignment mark 14 (FIG. 13B) is formed in the metal foil 12 and the support body 101 by using, for example, a laser. Although the alignment mark 14 illustrated in FIG. 13B is an opening penetrating the metal foil 12 and the support body 101, the alignment mark 14 can be an opening formed in the metal foil 12 as shown in FIG. 1B.

Figure 13C:
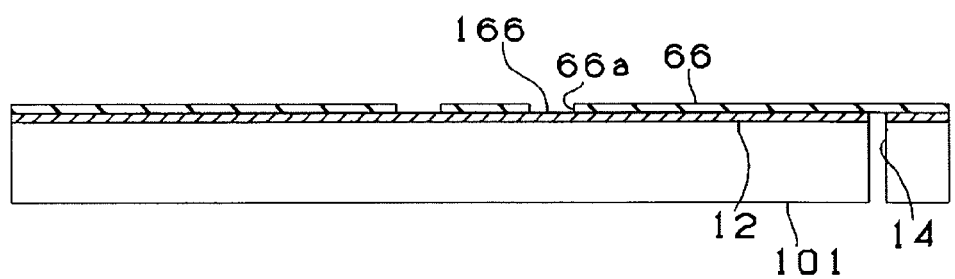
Figure 13D:
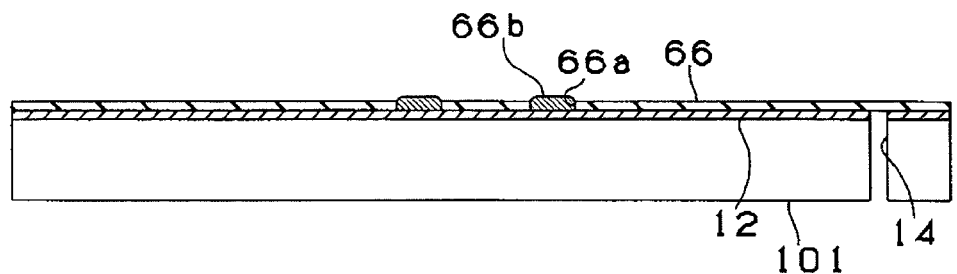

Subsequently, a resist layer 66, for example, a solder-resist layer having openings (66a) is formed on the metal foil 12 (FIG. 13C). The openings (66a) are formed at a position determined based on the alignment mark 14.

Using the metal foil 12 as a seed, a bump (66b) (FIG. 13D) is formed on a metal foil portion 166 (FIG. 13C) which is exposed through the opening (66a). The bump (66b) can be a gold-plated bump, and the resist layer 66 can function as a plating resist for gold plating.

Figure 14A:
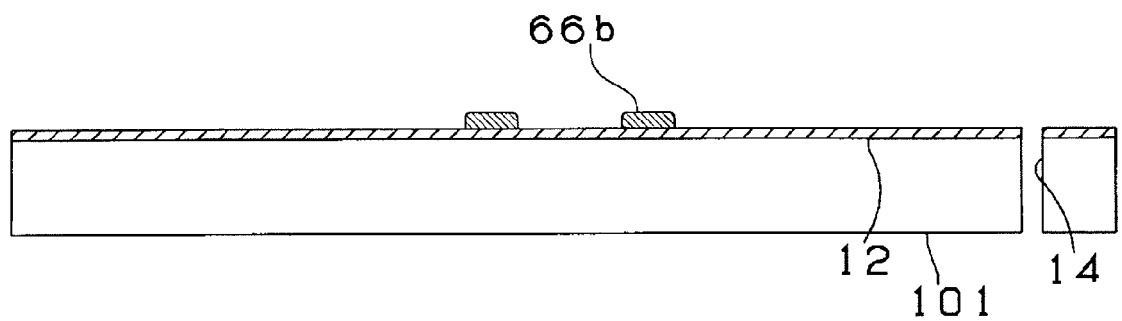
FIGS. 14A-14B are cross-sectional views of a multilayer printed wiring board being manufactured by a method according to a Fourth Embodiment.

The resist layer 66 can be removed by, for example, immersing the resist layer 66 in a 1-10% NaOH aqueous solution or by spraying a 1-10% NaOH aqueous solution over the resist layer 66, thereby leaving the bumps (66b) on the metal foil 12 (FIG. 14A).

Figure 14B:
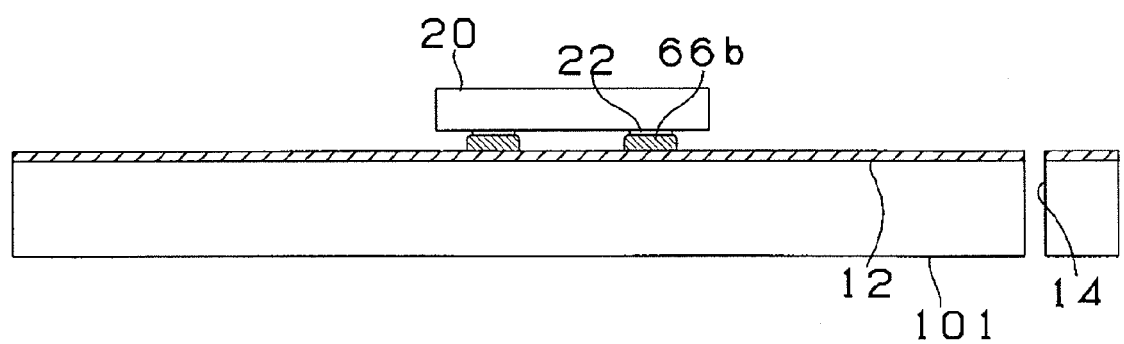

By using the alignment mark 14, an electronic component 20 having bumps (such as gold stud bumps) on a surface is placed over the metal foil 12 so that the bumps of the electronic component 20 are in alignment with the bumps (66b). The bumps are metallically bonded to each other, and the electronic component 20 is mounted on the metal foil 12 (FIG. 14B). Thereafter, by following the procedures similar to those in the Third Embodiment, a printed wiring board can be manufactured.

The following examples further illustrate the invention but, of course, should not be construed as in any way limiting its scope.

EXAMPLES

Example 1

This example demonstrates the production of a multilayer printed wiring board including a core substrate having a built-in IC chip.

(1) A copper foil with carrier, made by Mitsui Mining & Smelting Co., Ltd. (MTSD-H, copper foil: 5 μm, carrier (copper foil): 35 μm), is used as a starting material. An alignment mark is formed by using a laser.

(2) A commercially available solder-resist composition SR7200 (made by Hitachi Chemical Co., Ltd.) is applied to be 20 μm thick and dried to form a solder-resist layer. Based on the alignment mark, openings for forming bumps are formed in the solder-resist layer by using a laser.

(3) On the copper foil that is exposed through the openings in the solder-resist layer, solder paste is applied by printing. A reflow process is conducted at 200° C. to form bumps on the copper foil that is exposed through the openings.

(4) Based on the alignment mark, the position to load an IC chip is determined so that terminals of the IC chip are aligned with the solder bumps. After that, by connecting the solder bumps and the terminals of the IC chip by a reflow process at 200° C. to 250° C., the IC chip is mounted on the copper foil through the solder bumps.

(5) The underfill containing SMC375XX (made by Shin-Etsu Chemical Co., Ltd.) is filled into the space between the solder-resist layer and the IC chip.

(6) On the copper foil having the IC chip thereon, a resin film with a thickness of 200 μm (a B-stage resin film made with epoxy resin and silica filler in the amount of 50 wt. %) and another copper foil with a thickness of 5 μm are laminated. After that, the copper foil with carrier, the resin film and the copper foil where an IC chip is mounted are thermopressed and integrated. By the thermopressing, the IC chip is embedded into the resin film. The conditions for thermopressing are as follows: the pressure is 0.45 MPa, the temperature is 80° C., and the pressing time is 60 seconds. Subsequently, the resin film is set at 170° C. to become an insulation layer.

(7) In a core substrate with a mounted IC chip, penetrating holes for through-hole conductors are formed using a drill. After that, an electroless plating treatment and an electrolytic plating treatment are conducted to form through-hole conductors. At the same time, an electroless copper-plated film (first electroless plated film) and electrolytic copper-plated film (first electrolytic plated film) are formed on the surfaces of the copper foils.

(8) The core substrate having through-hole conductors is washed with water and dried. After that, a black oxide treatment is performed using a solution containing NaOH (10 g/l), NaClO$_2$ (40 g/l) and Na$_3$PO$_4$ (6 g/l). A reduction treatment is conducted using a solution containing NaOH (10 g/l) and NaBH$_4$ (6 g/l). Accordingly, a roughened surface is formed on the surfaces of the through-hole conductors and the electrolytic copper-plated film.

(9) A filling agent containing silica particles having an average particle diameter of 10 μm, epoxy resin and a curing agent is filled into the space in the through-hole conductors by screen-printing. The filling material is dried and cured.

Some of the filling agent that is bulging from through-hole conductors was removed by polishing.

(10) By applying a palladium catalyst (made by Atotech) and performing electroless copper plating on the substrate surfaces, an electroless copper-plated film with a thickness of 0.6 μm is formed. Moreover, electrolytic copper plating is performed under the following conditions to form an electrolytic copper-plated film with a thickness of 15 μm. At the same time, the filling agent filled in the through-hole conductors is covered with an electroless plated film (second electroless plated film) and an electrolytic plated film (second electrolytic plated film).

| electrolytic plating solution | |
|---|---|
| sulfuric acid | 180 g/l |
| copper sulfate | 80 g/l |
| additive (trade name: Cupracid GL, made by Atotech Japan) | 1 ml/l |

| electrolytic plating conditions | |
|---|---|
| electric current density | 1 A/dm$^2$ |
| time | 70 minutes |
| temperature | room temperature |

(11) By laminating a commercially available photosensitive dry film on an electrolytic plated film and exposing the film to light and developing it, an etching resist with a thickness of 15 μm is formed. The portions of copper foils not covered by the etching resist, and the plated films on the copper foils are dissolved and removed using an etching solution mainly containing copper (II) chloride. The plated films include the following: the first electroless plated film on the metal foil; the first electrolytic plated film on the first electroless plated film; the second electroless plated film on the first electrolytic plated film; and the second electrolytic plated film on the second electroless plated film. Furthermore, the etching resist is removed using a 5% KOH solution, and the conductive circuit on the resin insulation layer, the conductive circuit covering the filling agent, and pad portions are formed to obtain a core substrate. The conductive circuit and the pad portions on the resin insulation layer include the metal foil, the first electroless plated film on the metal foil, the first electrolytic plated film on the first electroless plated film, the second electroless plated film on the first electrolytic plated film, and the second electrolytic plated film on the second electroless plated film. The conductive circuit that covers the filling agent includes the second electroless plated film and the second electrolytic plated film on the second electroless plated film.

Lamination of interlayer resin insulation layers and conductive circuits on the core substrate is performed as follows. First, the surface of conductive circuit is roughened using "Cz8100" made by Mec Co., Ltd. to form a roughened portion.

(12) On the first and second surfaces of the core substrate, a resin film for the interlayer resin insulation layer (brand name: ABF-45SH, made by Ajinomoto Fine-Techno Co., Inc.) is laminated using vacuum lamination equipment. The conditions are vacuum degree of 67 Pa, pressure of 0.47 MPa, temperature of 85° C. and pressing time of 60 seconds. After that, the resin film for interlayer resin insulation layers is thermoset at 170° C. for 40 minutes to form interlayer resin insulation layers on the core substrate.

(13) Via-hole openings are formed in the interlayer resin insulation layer using a CO$_2$ gas laser.

The substrate having via-hole openings is immersed for 10 minutes in a solution containing permanganate 60 g/l at 80° C. to remove particles existing on the surface of the interlayer resin insulation layer. A roughened surface is formed on the surface of the interlayer resin insulation layer including the inner walls of via-hole openings.

After finishing the above treatment, the substrate is immersed in a neutralizing solution (made by Shipley Company L.L.C.) and washed with water. Furthermore, catalytic nuclei are adhered on the surface of the interlayer resin insulation layer and on the inner-wall surfaces of the via-hole openings, which has been treated to be roughened (a roughness depth of 3 μm).

(14) The substrate with adhered catalyst is immersed in an electroless copper plating solution (Thru-Cup PEA) made by C. Uyemura & Co., Ltd. and an electroless copper-plated film with a thickness in the range of 0.3-3.0 μm is formed on the entire roughened surface. An electroless copper-plated film is formed on the surface of the interlayer resin insulation layer and the inner walls of via-hole openings. The electroless plating is conducted at a solution temperature of 34° C. for 45 minutes.

(15) A commercially available photosensitive dry film Photec H-9300 (made by Hitachi Chemical Co., Ltd.) is laminated on the substrate having an electroless copper-plated film, exposed to light and developed to form a plating resist with a thickness of 25 μm. An electrolytic plating is performed under the conditions below to form an electrolytic copper-plated film with a thickness of 15 μm in the area where the plating resist is not formed.

| electrolytic plating solution | |
|---|---|
| sulfuric acid | 2.24 mol/l |
| copper sulfate | 0.26 mol/l |
| additive | 19.5 ml/l |
| (trade name: Cupracid GL, made by Atotech Japan) | |
| electrolytic plating conditions | |
| electric current density | 1 A/dm$^2$ |
| time | 70 minutes |
| temperature | 22 ± 2° C. |

(16) After the plating resist is removed, the electroless plated film underneath the plating resist is etched and removed using a mixed solution of sulfuric acid and hydrogen peroxide to form an independent conductive circuit and via holes. The same treatment as above is conducted and a roughened surface is formed on the surfaces of the conductive circuit and the via holes.

(17) By repeating (12)-(16), an upper-layer interlayer insulation layer having a conductive circuit and via holes is formed.

(18) A commercially available solder-resist composition is applied on the first and second surfaces of the multilayer wiring substrate, exposed to light and developed to form openings in the solder-resist composition. Heat treatments are conducted under the following conditions: 80° C. for one hour, 100° C. for one hour, 120° C. for one hour and 150° C. for three hours. Accordingly, solder-resist layers (first solder-resist layers, thickness: 15-25 μm) having openings are formed.

(19) On the surfaces of the conductive circuit and via holes which are exposed through the openings of the solder-resist layers, metal films are formed by disposing a nickel film and a gold-plated film in that order.

(20) After that, solder paste is printed on the metal films inside openings. By conducting a reflow at 230° C., solder bumps are formed on the first and second surfaces to obtain a multilayer printed wiring board.

Example 2

A copper foil with a carrier, made by Mitsui Mining & Smelting Co., Ltd. (MTSD-H, copper foil: 5 μm; carrier (copper foil): 35 μm), is used as a starting material. By using a laser, an alignment mark is formed on the copper foil. By using the alignment mark, the position for applying solder paste is determined, and the solder paste is disposed on the copper foil by potting. By conducting a reflow, solder bumps are formed on the copper foil. Based on the alignment mark, the loading position of an IC chip is determined and an IC chip is loaded on the solder bumps. A reflow is conducted to bond the solder bumps and terminals of the IC chip. The procedures afterwards are the same as those in the Example 1.

Example 3

In the same manner as in Example 1, a solder-resist layer is formed on the copper foil, on which an IC chip is mounted through solder bumps. An insulation film having an opening to accommodate the IC chip and an alignment mark is prepared. The insulation film is a prepreg with a thickness of 150 μm. On the copper foil with the mounted IC chip, the prepreg is laminated by using an alignment mark formed in the copper foil and the alignment mark formed in the insulation film. The opening and the IC chip are aligned accurately. A second insulative film (prepreg made by Hitachi Chemical Co., Ltd.) with a thickness of 50 μm, and a copper foil with a thickness of 5 μm are laminated on the prepreg. The copper foil with the carrier having a mounted IC chip, the prepreg, the insulative film and the copper foil are thermopressed using vacuum pressing equipment. During the thermopressing, the resin material seeped from the second insulative film and prepreg into the opening of the prepreg. At the same time, the prepreg is cured and becomes a resin substrate, the second insulative film is cured and becomes a resin insulation layer, and the resin that seeps into the opening is cured and becomes a filler resin. The carrier is removed. After that, similarly to Example 1, build-up layer structures including insulation layers are formed on the core substrate with a built-in IC chip. An insulation substrate having a resin substrate and insulation layers integrated is thus obtained.

Example 4

This example is similar to the Example 1 except that a copper foil with a thickness of 18 μm is used as a starting material. A printed wiring board with a built-in IC chip is manufactured similarly to Example 1.

Example 5

This example is similar to Example 2 except that a copper foil with a thickness of 18 μm is used as a starting material. A printed wiring board with a built-in IC chip is manufactured similarly to Example 2.

Example 6

This example is similar to Example 3 except that a copper foil with a thickness of 18 μm is used as a starting material. A printed wiring board with a built-in IC chip is manufactured similarly to Example 3.

Example 7

This example is similar to Example 1 except that gold bumps, instead of solder bumps, are used to mount the IC chip on the copper foil. Specifically, after forming openings in the resist layer, gold bumps (gold-plated bumps) are formed on the copper foil that is exposed through the openings formed in the resist layer. Using a copper foil as a lead, the gold-plated bumps are formed on the IC chip by using Microfab Au (made by Tanaka Kikinzoku Group). An IC chip having gold stud bumps is aligned with gold bumps (gold-plated bumps) based on alignment mark. By metallically bonding the gold bumps (gold-plated bumps) and the gold stud bumps, the IC chip is mounted on the copper foil. Similarly to Example 1, a printed wiring board with a built-in IC chip is obtained.

Example 8

A copper foil with carrier, made by Mitsui Mining & Smelting Co., Ltd. (MTSD-H, copper foil: 5 µm, carrier (copper foil): 35 µm), is used as a starting material. A penetrating hole as an alignment mark is formed in the copper foil and a support body using a laser. A plating resist having openings is formed on the copper foil. Openings are formed based on the location of the alignment mark. Using the copper foil as a seed, gold-plated bumps are formed on the copper foil that is exposed through the openings. Subsequently, the plating resist is removed. By using the alignment mark, an IC chip having gold-stud bumps is aligned with the gold-plated bumps. By metallically bonding the gold bumps (gold-plated bumps) and the gold-stud bumps, the IC chip is mounted on the copper foil. After that, similarly to Example 3, a printed wiring board with a built-in IC chip is produced.

All references, including publications, patent applications, and patents, cited herein are hereby incorporated by reference to the same extent as if each reference are individually and specifically indicated to be incorporated by reference and are set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for manufacturing a printed wiring board, comprising:
   forming an alignment mark in a metal foil;
   forming a bump on the metal foil at a position determined based on the alignment mark;
   positioning an electronic component over the metal foil, the positioning comprising aligning a terminal of the electronic component with the bump based on the alignment mark;
   connecting the terminal of the electronic component with the bump;
   forming an insulation layer enclosing the electronic component connected with the bump such that the electronic component is placed inside a printed wiring board; and
   patterning the metal foil to which the electronic component is connected through the bump.

2. The method of claim 1, further comprising:
   forming a resist layer over the metal foil; and
   forming an opening in the resist layer at a position determined based on the alignment mark such that the bump is formed in the opening.

3. The method of claim 2, further comprising removing the resist layer after forming the bump in the opening.

4. The method of claim 2, wherein forming the bump includes printing a solder paste on the metal foil and conducting a reflow.

5. The method of claim 1, wherein forming the bump includes placing a solder ball on the metal foil.

6. The method of claim 1, wherein forming the bump includes placing a gold plated ball on the metal foil.

7. The method of claim 1, further comprising filling an underfill into a space between the electronic component and the metal foil.

8. The method of claim 1, wherein forming the insulation layer includes placing an uncured resin film over the electronic component and curing the uncured resin film.

9. The method of claim 8, wherein the uncured resin film is thermopressed on the electronic component and cured to form the insulation layer.

10. The method of claim 1, further comprising:
    preparing an insulation film having an opening for accommodating the electronic component therein; and
    placing the insulation film over the metal foil such that the electronic component is positioned in the opening in the insulation film.

11. The method of claim 10, wherein the insulation film has an alignment mark, and the opening in the insulation film is formed at a position determined based on the alignment mark of the insulation film.

12. The method of claim 11, wherein the insulation film is placed at a position determined based on the alignment mark of the insulation film and the alignment mark of the metal foil.

13. The method of claim 10, wherein the insulation film comprises an uncured resin material, and the insulation film is thermopressed and cured over the metal foil.

14. The method of claim 10, wherein the insulation film comprises a material selected form the group consisting of glass cloth, glass fabric and aramid fabric.

15. The method of claim 1, wherein the alignment mark is formed by forming an opening in the metal foil.

16. The method of claim 1, wherein the metal foil is laminated on a support body, and the alignment mark is formed by forming an opening in the metal foil and the support body.

17. The method of claim 1, further comprising forming a conductive circuit over the metal foil, the conductive circuit being patterned based on the alignment mark such that the conductive circuit has a pad portion connected to the bump.

18. The method of claim 1, further comprising forming at least one plated film over the metal foil,
    wherein the patterning of the metal foil comprises patterning the at least one plated film, and the patterning of the metal foil and the at least one plated film provides a conductive circuit having a circuit pattern.

* * * * *